United States Patent
Matsuo et al.

(10) Patent No.: US 6,249,015 B1
(45) Date of Patent: *Jun. 19, 2001

(54) SEMICONDUCTOR DEVICE AND FABRICATION METHOD THEREOF

(75) Inventors: Hiroshi Matsuo; Yuichi Yokoyama; Takuji Oda; Kiyoshi Maeda; Shinya Inoue; Yuji Yamamoto, all of Hyogo (JP)

(73) Assignees: Mitsubishi Denki Kabushiki Kaisha, Tokyo; Ryoden Semiconductor System Engineering Corporation, Hyogo, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/115,514

(22) Filed: Jul. 15, 1998

(30) Foreign Application Priority Data

Dec. 24, 1997 (JP) .................................................... 9-355330

(51) Int. Cl.[7] .......................... H01L 27/108; H01L 29/76; H01L 29/94; H01L 31/119

(52) U.S. Cl. .......................... 257/296; 257/303; 257/304; 257/305; 257/306

(58) Field of Search .................................... 257/296, 303, 257/304, 305, 306; 438/396, 595, 638, 639, 640

(56) References Cited

U.S. PATENT DOCUMENTS

| | | | |
|---|---|---|---|
| 5,053,849 | * 10/1991 | Izawa et al. | 257/401 |
| 5,394,012 | * 2/1995 | Kimura | 257/739 |
| 5,605,857 | * 2/1997 | Jost et al. | 438/253 |
| 5,723,381 | * 3/1998 | Grewal et al. | 438/633 |
| 5,786,249 | * 7/1998 | Dennison | 438/241 |

FOREIGN PATENT DOCUMENTS

| | | |
|---|---|---|
| 9-64302 | 3/1997 | (JP) . |
| 9-148571 | 6/1997 | (JP) . |

* cited by examiner

Primary Examiner—Tom Thomas
Assistant Examiner—Thien F. Tran
(74) Attorney, Agent, or Firm—McDermott, Will & Emery (57) ABSTRACT

A hard mask insulating layer is formed on a gate electrode which is formed on a main surface of a silicon substrate with a gate insulating layer interposed. An SiN sidewall spacer is directly formed on a thin $SiO_2$ layer which is formed to cover a side surface of the gate electrode. A contact hole is formed to penetrate an interlayer insulating layer formed on an SiN stopper layer and reach the main surface of the silicon substrate.

4 Claims, 11 Drawing Sheets

⟨MEMORY CELL PORTION⟩

FIG.13B

⟨PERIPHERAL CIRCUIT PORTION⟩

FIG.14A

⟨MEMORY CELL PORTION⟩

FIG.14B

⟨PERIPHERAL CIRCUIT PORTION⟩

FIG.15A

⟨MEMORY CELL PORTION⟩

FIG.15B

⟨PERIPHERAL CIRCUIT PORTION⟩

FIG.16A
⟨MEMORY CELL PORTION⟩

FIG.16B
⟨PERIPHERAL CIRCUIT PORTION⟩

FIG.17A
⟨MEMORY CELL PORTION⟩

FIG.17B
⟨PERIPHERAL CIRCUIT PORTION⟩

FIG.18A
⟨MEMORY CELL PORTION⟩

FIG.18B
⟨PERIPHERAL CIRCUIT PORTION⟩

SEMICONDUCTOR DEVICE AND FABRICATION METHOD THEREOF

BACKGROUND OF THE INVENTION

1. Field of the Invention

The present invention relates to a semiconductor device and a method of fabricating a semiconductor device. In particular, the present invention relates to a semiconductor device and a fabrication method thereof employing a nitride stopper method applied to memory cells such as a DRAM (Dynamic Random Access Memory) and an SRAM (Static Random Access Memory).

2. Description of the Background Art

Figure 19:
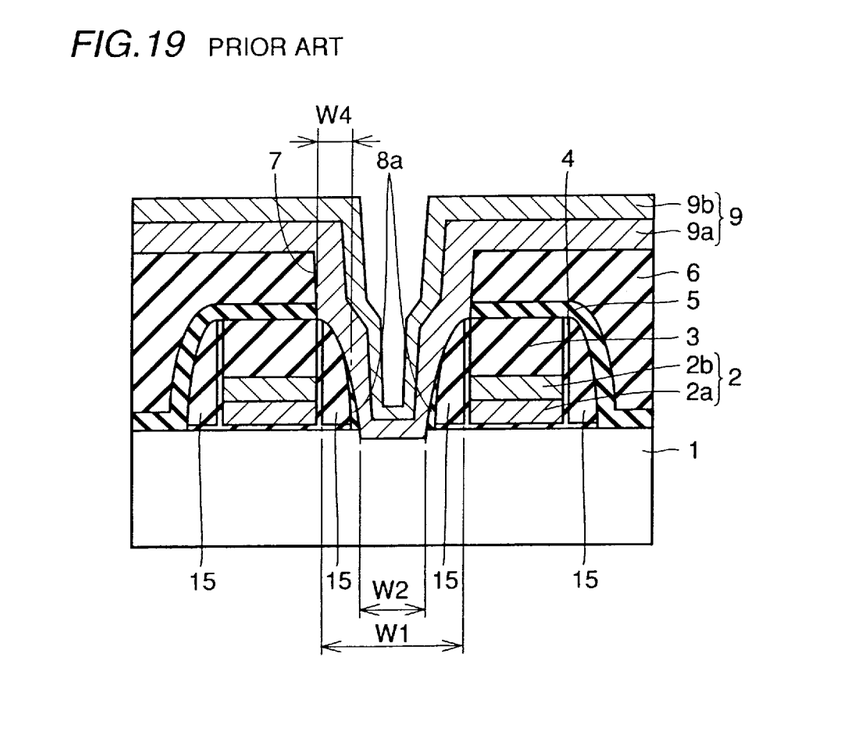
FIG. 19 is a cross sectional view showing an example of a conventional semiconductor device.

A semiconductor device which employs the so called nitride stopper method using a nitride layer as a stopper layer has been known. FIG. 19 shows one example of a conventional semiconductor device employing the nitride stopper method.

Referring to FIG. 19, on a main surface of a silicon substrate 1, a pair of gate electrodes 2 is formed with a gate insulating layer interposed. Gate electrode 2 has, for example, a doped polysilicon layer 2a and a WSi layer 2b.

A hard mask insulating layer 3 formed of $SiO_2$ or the like is formed on gate electrode 2. A thin $SiO_2$ layer 4 is formed to cover hard mask insulating layer 3 and gate electrode 2. An $SiO_2$ sidewall spacer 15 is formed to cover side surfaces of gate electrode 2 and hard mask insulating layer 3 with the thin $SiO_2$ covering layer 4 interposed.

An SiN stopper layer 5 is formed to cover hard mask insulating layer 3 and $SiO_2$ sidewall spacer 15. An interlayer insulating layer 6 formed of $SiO_2$ or the like is formed to cover SiN stopper layer 5. A contact hole 7 is formed such that contact hole 7 penetrates interlayer insulating layer 6, SiN stopper layer 5 and thin $SiO_2$ layer 4 to reach the main surface of silicon substrate 1. Contact hole 7 is provided to reach one $SiO_2$ sidewall spacer 15, and an SiN sidewall spacer 8a is left on the surface of the one $SiO_2$ sidewall spacer 15.

An interconnection layer 9 is formed to extend from the inside of contact hole 7 onto interlayer insulating layer 6. Interconnection layer 9 includes a doped polysilicon layer 9a and a WSi layer 9b formed thereon.

An isolation width W4 is defined by the combined thickness of the one $SiO_2$ sidewall spacer 15 and that of SiN sidewall spacer 8a formed on the surface of spacer 15. Insulation between gate electrode 2 and interconnection layer 9 can be obtained by setting a value of separation width W4 at a prescribed value or more. In the case of FIG. 19, for example, if a width W1 between electrodes adjacent to each other is 0.24 μm, an opening width W2 of the bottom of contact hole 7 is approximately 0.06 μm.

Figure 20:
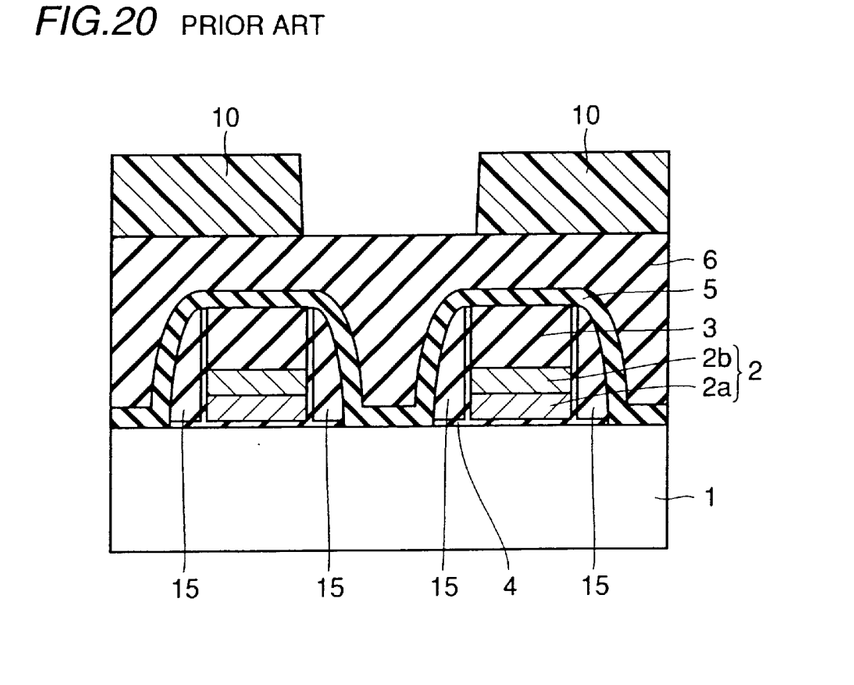
FIGS. 20–22 are cross sectional views respectively showing the first to the third steps of a fabrication process of the semiconductor device shown in FIG. 19.
Figure 21:
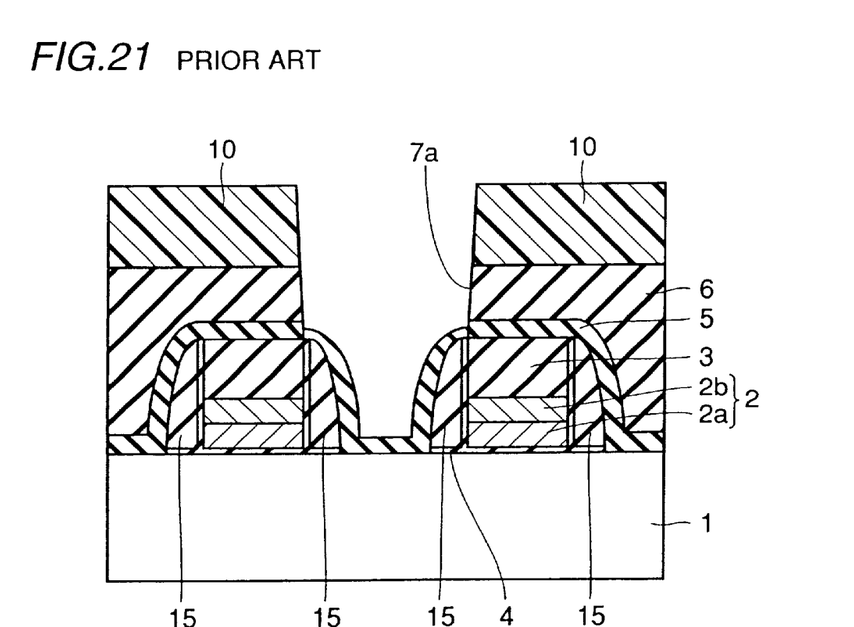
Figure 22:
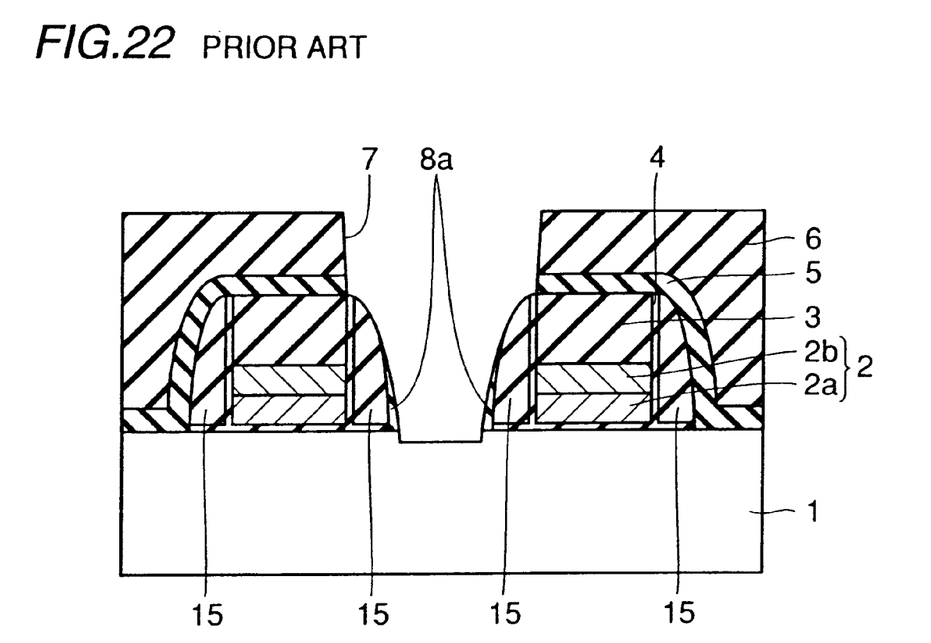

Referring to FIGS. 20–22 next, a method of fabricating the semiconductor device shown in FIG. 19 is described. FIGS. 20–22 are cross sectional views showing the first to the third steps of a fabrication process of the semiconductor device shown in FIG. 19.

First with reference to FIG. 20, gate electrode 2 and hard mask insulating layer 3 are formed on the main surface of silicon substrate 1 with a gate insulating layer interposed, and thin $SiO_2$ layer 4 is formed to cover these by CVD (Chemical Vapor Deposition) or the like. A silicon oxide layer is deposited on thin $SiO_2$ layer 4 by CVD or the like, and an anisotropic etching process is applied to the silicon oxide layer. $SiO_2$ sidewall spacer 15 is thus formed. Etching of $SiO_2$ sidewall spacer 15 uses plasma. Therefore, plasma is applied to the main surface of silicon substrate 1.

SiN stopper layer 5 is formed to cover $SiO_2$ sidewall spacer 15 and hard mask insulating layer 3 by the CVD or the like. Interlayer insulating layer 6 formed of $SiO_2$ or the like is formed on SiN stopper layer 5 by CVD or the like. A resist 10 patterned into a prescribed shape is provided on interlayer insulating layer 6.

Next with reference to FIG. 21, interlayer insulating layer 6 is selectively etched using resist 10 as a mask. The etching is stopped by SiN stopper layer 5 and an opening 7a is formed.

SiN stopper layer 5 is next etched. As a result, contact hole 7 which selectively exposes the main surface of silicon substrate 1 is formed as shown in FIG. 22. An over etching process is applied to SiN stopper layer 5 so that SiN sidewall spacer 8a having a small thickness is left on the surface of $SiO_2$ sidewall spacer 15 as shown in FIG. 22.

Interconnection layer 9 is thereafter formed to extend from the inside of contact hole 7 onto interlayer insulating layer 6 by CVD or the like. Accordingly, the semiconductor device shown in FIG. 19 is obtained through the processes described above.

Because of the plasma applied to the main surface of silicon substrate 1 exposed while $SiO_2$ sidewall spacer 15 is formed, a problem as described below arises.

Although not shown in FIG. 19, an element isolation oxide layer is formed to surround an element formation region where an MOS transistor or the like including gate electrode 2 is formed. Stress generated when the element isolation oxide layer is formed tends to remain in the vicinity of the periphery of the element isolation oxide layer.

$SiO_2$ sidewall spacer 15 is generally extended over the element isolation oxide layer, and a pn junction may be formed about the periphery of the element isolation oxide layer where the stress remains. In this case, the plasma is applied to the portion where the pn junction is formed. Therefore, leakage current could be easily generated at the pn junction portion. The generated leakage current deteriorates the refresh characteristic of a capacitor if the semiconductor device is a DRAM.

In addition, the opening width W2 of the bottom of contact hole 7 becomes as small as approximately 0.06 μm by forming $SiO_2$ sidewall spacer 15 as shown in FIG. 19 and as described above. As a result, the area of the opening at the bottom of contact hole 7 is decreased.

SUMMARY OF THE INVENTION

The present invention is made to solve the problems described above. An object of the invention is to provide a semiconductor device and a fabrication method thereof by which generation of leakage current resulting from the plasma applied to the main surface of the semiconductor substrate can be restricted, and the area of the opening at the bottom of the contact hole can be increased without increasing the spacing between gate electrodes.

A semiconductor device according to the present invention includes a gate electrode, a hard mask insulating layer, a thin insulating layer, a nitride stopper layer, a sidewall nitride layer, an interlayer insulating layer, and an interconnection layer. The gate electrode is formed on a main surface of a semiconductor substrate. The hard mask insulating layer is formed on a top surface of the gate electrode. The thin insulating layer is formed to cover a side surface of the gate electrode and the hard mask insulating layer. The thin insulating layer refers to an insulating layer having a thickness of approximately 5–20 nm, for example. The nitride stopper layer is directly formed on the thin insulating layer to extend from a portion on one side surface of the gate electrode onto a top surface of the hard mask insulating layer. The sidewall nitride layer is directly formed on the thin insulating layer to cover the other side surface of the gate electrode. The interlayer insulating layer is formed to cover the nitride stopper layer, and provided with a contact hole formed in a self alignment manner that reaches the main surface of the semiconductor substrate and the sidewall nitride layer. The interconnection layer is formed in the contact hole. The sidewall nitride layer may have its upper end on a side surface of the hard mask insulating layer or may cover the side surface of the hard mask insulating layer and be connected to the nitride stopper layer, provided that the sidewall nitride layer tapers away from the semiconductor substrate.

According to the semiconductor device of the present invention, the nitride stopper layer is directly formed on the thin insulating layer, and $SiO_2$ sidewall spacer 15 is not provided between the thin insulating layer and the nitride stopper layer as in the conventional semiconductor device. Since $SiO_2$ sidewall spacer 15 which is formed with the plasma is not provided, application of the plasma to the main surface of the silicon substrate can be avoided. As a result, generation of leakage current which is a problem of the conventional semiconductor device can be effectively minimized. Further, since $SiO_2$ sidewall spacer 15 is not formed, the area of the opening at the bottom of the contact hole formed in the self-aligned manner between gate electrodes can be increased without increasing spacing between gate electrodes adjacent to each other compared with the conventional semiconductor device. Since the sidewall nitride layer is provided between the gate electrode and the interconnection layer, insulation between the gate electrode and the interconnection layer can be obtained by the presence of the sidewall nitride layer.

Preferably, the thickness of the hard mask insulating layer is 120 nm or more. The value of the highest limit of the thickness of the hard mask insulating layer is the maximum value that allows the layer to be fabricated. Preferably, the height of the sidewall nitride layer in the direction perpendicular to the main surface of the semiconductor substrate is larger than the thickness of the gate electrode in the perpendicular direction by 20 nm or more.

Figure 1:
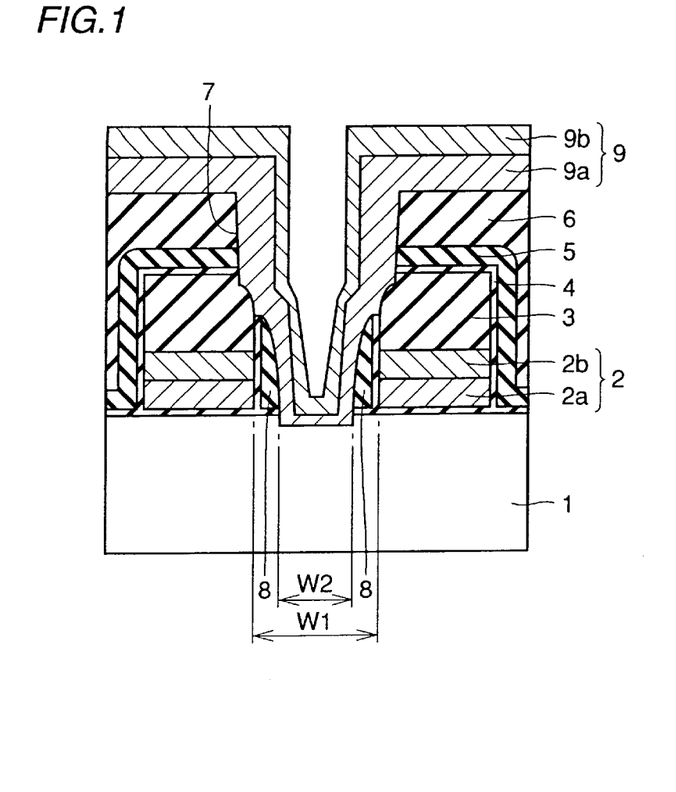
FIG. 1 is a cross sectional view showing a semiconductor device according to the first embodiment of the invention.
Figure 3:
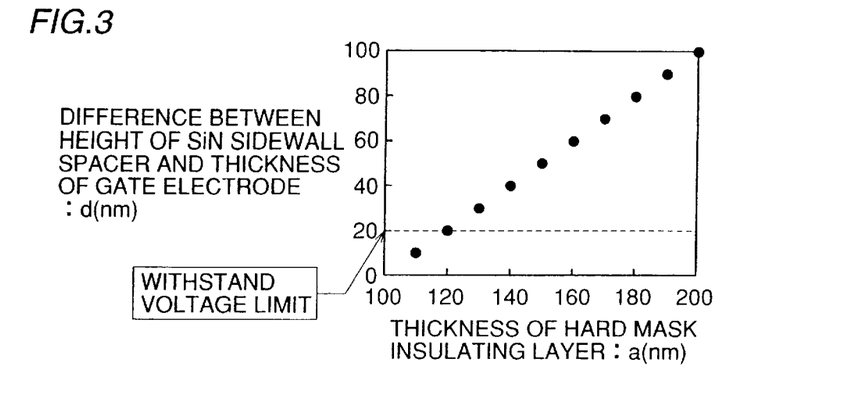
FIG. 3 shows a relation between a difference d between a height of an SiN sidewall spacer and a thickness of a gate electrode, and a thickness of a hard mask insulating layer.
Figure 4:
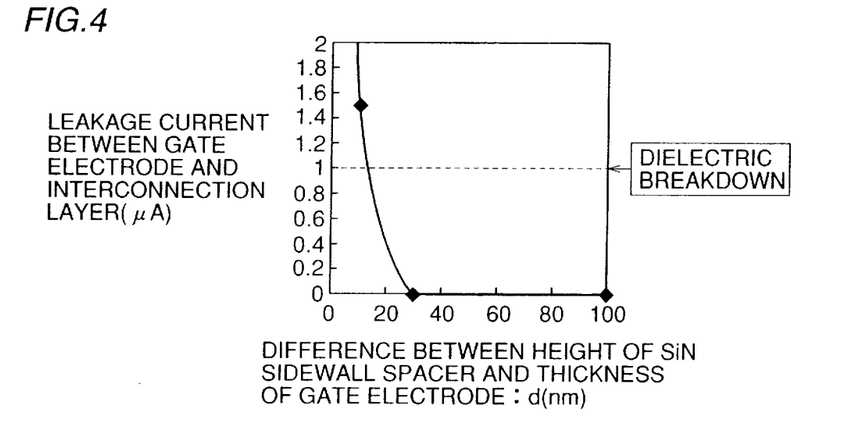
FIG. 4 shows a relation between leakage current between a gate electrode and an interconnection layer, and a difference d between a height of an SiN sidewall spacer and a thickness of a gate electrode.

The inventors of the present invention noted the relation between generation of leakage current generated between the gate electrode and the interconnection layer in the structure shown in FIG. 1 of the present invention, and a value d(nm) of the difference between the height of the sidewall nitride layer and the thickness of the gate electrode, and examined the relation. The result is shown in FIG. 4. The result shown in FIG. 4 proves that generation of leakage current can be almost eliminated if the value of d is 20 nm or more. In addition, the inventors of the invention noted the relation between the value of d and the thickness a (nm) of the hard mask insulating layer, and examined it. The result is shown in FIG. 3. As shown in FIG. 3, the value of d becomes 20 nm or more when the value of the thickness a is 120 nm or more. Accordingly, by setting the value of the thickness a of the hard mask insulating layer at 120 nm or more, the value of d can be set at 20 nm or more, so that generation of leakage current between the gate electrode and the interconnection layer can be effectively minimized.

A concave portion may be formed at the main surface of the semiconductor substrate in the vicinity of the sidewall nitride layer. Preferably, a part of the interconnection layer fills the inside of the concave portion.

A layer which is changed in quality located at the bottom of the contact hole can be removed by providing the concave portion at the semiconductor substrate. The part of the interconnection layer which fills the inside of the concave portion reduces contact resistance between the interconnection layer and the semiconductor substrate.

The upper portion of the other surface of the gate electrode may be recessed from the side surface of the hard mask insulating layer toward the inside of the gate electrode.

As shown in FIG. 1, the sidewall nitride layer has a shape which tapers in width towards the upper portion (in the direction away from the semiconductor substrate). Therefore, insulation between the upper corner portion of the gate electrode and the interconnection layer is necessary. If the upper portion of the other side surface of the gate electrode located on the side of the interconnection layer is recessed into the gate electrode, a distance between the upper corner portion of the gate electrode and the interconnection layer can be increased. As a result, withstand voltage between the gate electrode and the interconnection layer can be improved.

The semiconductor device may have a memory cell portion and a peripheral circuit portion. In this case, the gate electrode is arranged within the memory cell portion. Within the peripheral circuit portion, another gate electrode having a metal silicide part at its upper portion is formed. On a top surface of the another gate electrode, another hard mask insulating layer is formed. Another thin insulating layer is formed to cover a side surface of the another gate electrode and the another hard mask insulating layer. A pair of another sidewall nitride layers is directly formed on the another thin insulating layer to cover both side surfaces of the another gate electrode. The interlayer insulating layer extends over the another hard mask insulating layer to be in contact with a top surface of the another hard mask insulating layer, and another contact hole which penetrates the interlayer insulating layer, the another hard mask insulating layer and the metal silicide part, and has its bottom surface within the another gate electrode is formed. Another interconnection layer is formed in the another contact hole to be electrically connected to the another gate electrode.

The nitride stopper layer does not cover the top surface of the another hard mask insulating layer located in the peripheral circuit portion. Therefore, using the same mask, the contact hole that reaches the main surface of the semiconductor substrate can be formed in the memory cell portion in the self alignment manner, and another contact hole which penetrates the metal silicide part and has its bottom surface in the gate electrode can be formed in the peripheral circuit portion. As a result, the fabrication process can be simplified and the cost can be reduced.

According to one aspect of a method of fabricating a semiconductor device according to the present invention, steps as described below are provided. A gate electrode is formed on a main surface of a semiconductor substrate. A hard mask insulating layer is provided on a top surface of the gate electrode. A thin insulating layer is formed to cover the gate electrode and the hard mask insulating layer. A nitride stopper layer is directly formed on the thin insulating layer. An interlayer insulating layer is formed to cover the nitride stopper layer. By etching the interlayer insulating layer, the nitride stopper layer, and the thin insulating layer successively, a contact hole formed in the self alignment manner which reaches the main surface of the semiconductor substrate, as well as a sidewall nitride layer formed on a side surface of the gate electrode are provided. An interconnection layer is formed in the contact hole.

According to the one aspect of the method of fabricating a semiconductor device according to the present invention as described above, the nitride stopper layer is directly provided on the thin insulating layer, and SiO$_2$ sidewall spacer 15 is not formed between the thin insulating layer and the nitride stopper layer as in the conventional semiconductor device. Therefore, the plasma is not applied to the main surface of the semiconductor substrate, so that generation of leakage current can be effectively minimized. In addition, the area of the opening at the bottom of the contact hole can be increased compared with the conventional device when the contact hole is formed in the self alignment manner between gate electrodes adjacent to each other. Further, since SiO$_2$ sidewall spacer 15 is not formed, the fabrication process can be simplified to reduce the cost. Insulation between the gate electrode and the interconnection layer can be obtained by the presence of the sidewall nitride layer.

The step of forming the contact hole may include a step of forming a concave portion by isotropically etching the main surface of the exposed semiconductor substrate. Further, the step of forming the interconnection layer may include a step of forming an interconnection layer such that the layer fills the concave portion.

By isotropically etching the main surface of the semiconductor substrate as described above, a layer which is different in quality located at the bottom of the contact hole can be removed, and the concave portion can be formed. Contact resistance between the interconnection layer and the semiconductor substrate can be decreased by filling a part of the interconnection layer in the concave portion.

The step of forming the hard mask insulating layer may include a step of forming a hard mask insulating layer such that it has a thickness of 120 nm or more. The step of forming the sidewall nitride layer may include a step of forming a sidewall nitride layer such that the height of the sidewall nitride layer in the direction perpendicular to the main surface of the semiconductor substrate is larger than the thickness of the gate electrode in the perpendicular direction by 20 nm or more.

By setting the thickness of the hard mask insulating layer at 120 nm or more, the difference between the height of the sidewall nitride layer in the direction perpendicular to the main surface of the semiconductor substrate and that of the gate electrode in the perpendicular direction d can be set at 20 nm or more. Generation of leakage current between the gate electrode and the interconnection layer can be effectively minimized by setting the value of d at 20 nm or more as shown in FIG. 4. As a result, a semiconductor device in which improved withstand voltage between the gate electrode and the interconnection layer is obtained can be provided.

The method of fabricating a semiconductor device described above may include a step of recessing an upper portion of the side surface of the gate electrode into the gate electrode from the side surface of the hard mask insulating layer, by etching the upper portion of the side surface of the gate electrode after the hard mask insulating layer is formed.

A distance between the upper corner portion of the gate electrode and the interconnection layer can be increased by recessing the upper portion of the side surface of the gate electrode into the gate electrode from the side surface of the hard mask insulating layer. The most important issue of the semiconductor device is the withstand voltage between the upper corner portion of the gate electrode and the interconnection layer as described above. Therefore, increase of the distance between the upper corner portion of the gate electrode and the interconnection layer allows a semiconductor device having an improved withstand voltage between the gate electrode and the interconnection layer to be provided.

According to another aspect of the method of fabricating a semiconductor device according to the present invention, the method comprises fabricating a semiconductor device having a memory cell portion and a peripheral circuit portion. The fabrication method of a semiconductor device according to this aspect includes the processes described below. A first hard mask insulating layer is formed on a main surface of a semiconductor substrate located in the memory cell portion with a first gate electrode interposed, and a second hard mask insulating layer is formed on a main surface located in the peripheral circuit portion with a second gate electrode interposed. A thin insulating layer is formed to cover the first and second hard mask insulating layers as well as side surfaces of the first and second gate electrodes. A nitride stopper layer is directly provided on the thin insulating layer. A first mask layer is formed to cover the nitride stopper layer located within the memory cell portion. The second hard mask insulating layer is exposed and a pair of sidewall nitride layers that covers the side surface of the second gate electrode is formed by etching the nitride stopper layer using the first mask layer. An interlayer insulating layer is provided to cover the nitride stopper layer and the second hard mask insulating layer. A second mask layer is formed on the interlayer insulating layer. Using the second mask layer, a first contact hole that is formed in self alignment manner and selectively exposes the main surface of the semiconductor substrate is provided by etching the interlayer insulating layer, the nitride stopper layer, and the thin insulating layer located in the memory cell portion successively, and a second contact hole which reaches the second gate electrode is formed by successively etching the interlayer insulating layer and the second hard mask insulating layer located within the peripheral circuit portion. First and the second interconnection layers are respectively formed in the first and second contact holes.

The nitride stopper layer on the second hard mask insulating layer is preliminary removed using the first mask layer. Therefore, using the second mask layer, the first contact hole formed in the self alignment manner can be formed in the memory cell portion and the second contact hole can be provided in the peripheral circuit portion. Since the first and second contact holes can be formed by using the same mask, the fabrication process can be simplified to decrease the fabrication cost.

The second gate electrode may include a metal silicide part at its upper portion. In this case, the steps of forming the first and second contact holes may include a step of forming a concave portion at the main surface of the semiconductor substrate after the main surface is exposed and forming the second contact hole such that the hole penetrates the metal silicide part.

Since the concave portion is formed at the main surface of the semiconductor substrate, the area where the interconnection layer and the semiconductor substrate are in contact with each other can be increased, resulting in reduction of contact resistance therebetween. Further, the second contact hole is formed to penetrate the metal silicide part, so that a portion of the gate electrode other than the metal silicide part and the interconnection layer can be in contact with each other. For example, if the interconnection layer is formed of doped polysilicon, impurities from the interconnection layer are absorbed by the metal silicide part since the metal silicide part of the second gate electrode is in contact with the interconnection layer. As a result, a portion where an impurity concentration is low is generated where the second gate electrode and the interconnection layer are connected to each other, and contact resistance between the second gate electrode and the interconnection layer increases. In particular, if the interconnection layer is in contact with only the metal silicide part, a problem is an increase of the contact resistance. If the interconnection layer is in contact with the portion other than the metal silicide part, generation of the portion where the impurity concentration is low can be limited to achieve reduction of the contact resistance.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 14A and 14B to 18A and 18B are cross sectional views showing the first to the fifth steps of the fabrication process of the semiconductor device shown in FIG. 13.

DESCRIPTION OF THE PREFERRED EMBODIMENTS

Embodiments of the present invention are hereinafter described referring to FIGS. 1–18.

First Embodiment

Referring to FIGS. 1–7, the first embodiment of the invention is described. FIG. 1 is a cross sectional view illustrating a semiconductor device according to the first embodiment of the invention. Although description is given on a case in which the invention is applied to a DRAM, the invention is applicable to another semiconductor memory device such as an SRAM.

Referring to FIG. 1, a pair of gate (transfer gate) electrodes 2 is formed on a main surface of a silicon substrate 1 with a gate insulating layer interposed. Gate electrode 2 includes a doped polysilicon layer 2a and a WSi layer 2b formed thereon. Doped polysilicon layer 2a has, for example, a thickness of approximately 40–80 nm. WSi layer 2b has a thickness of approximately 40–80 nm. Layer 2b may also be formed of a conductive layer with low resistance such as W.

A hard mask insulating layer 3 formed of, for example, $SiO_2$ is formed on a top surface of gate electrode 2. Hard mask insulating layer 3 has, for example, a thickness of approximately 100–250 nm. A thin $SiO_2$ layer 4 is formed to cover hard mask insulating layer 3 and a side surface of gate electrode 2. Thin $SiO_2$ layer 4 has a flat surface and a thickness of approximately 5–20 nm.

An SiN (silicon nitride) stopper layer 5 is formed to extend from a portion on one side surface of gate electrode 2 over a top surface of hard mask insulating layer 3. SiN stopper layer 5 functions as a self alignment stopper layer, and has a thickness of approximately 40–100 nm. On the other side surface of gate electrode 2, an SiN sidewall spacer 8 is formed. SiN sidewall spacer 8 is directly formed on the thin $SiO_2$ layer 4. SiN sidewall spacer 8 may have its upper end portion on the side surface of hard mask insulating layer 3 as shown in FIG. 1. However, SiN sidewall spacer 8 may cover the side surface of hard mask insulating layer 3 and be connected to SiN stopper layer 5. In other words, a silicon nitride layer portion may remain between SiN sidewall spacer 8 and SiN stopper layer 5 that integrally connects them in FIG. 1.

An interlayer insulating layer 6 formed of $SiO_2$ or the like is formed to cover SiN stopper layer 5. A contact hole 7 formed in self alignment manner is provided to penetrate interlayer insulating layer 6, SiN stopper layer 5, and thin $SiO_2$ layer 4 to reach the main surface of silicon substrate 1. SiN sidewall spacer 8 is formed around contact hole 7 to define an opening at the bottom of contact hole 7.

An interconnection layer (bit line) 9 is formed to extend from the inside of contact hole 7 onto interlayer insulating layer 6. Interconnection layer 9 is constituted of a doped polysilicon layer 9a and a WSi layer 9b formed thereon.

As shown in FIG. 1, $SiO_2$ sidewall spacer 15 in the conventional semiconductor device is not found between SiN sidewall spacer 8 and thin $SiO_2$ layer 4. Therefore, the opening width W2 at the bottom of contact hole 7 can be increased compared with that of the conventional device. Specifically, if the interval W1 between gate electrodes 2 adjacent to each other is 0.24 $\mu$m, the opening width W2 is 0.14 $\mu$m. Since opening width W2 is 0.06 $\mu$m in the conventional device, the area of the opening at the bottom of contact hole 7 can be dramatically increased compared with that of the conventional device. Accordingly, the area where interconnection layer 9 and silicon substrate 1 are in contact with each other can be increased, and contact resistance can be decreased.

Since $SiO_2$ sidewall spacer 15 is not present, plasma used for forming $SiO_2$ sidewall spacer 15 is never applied to the main surface of silicon substrate 1. Therefore, generation of leakage current caused by application of the plasma to the peripheral portion of an element isolation oxide film formed in an element isolation region of silicon substrate 1 can be effectively avoided. Accordingly, a semiconductor device which is reliable and has a high performance can be obtained.

Figure 2:
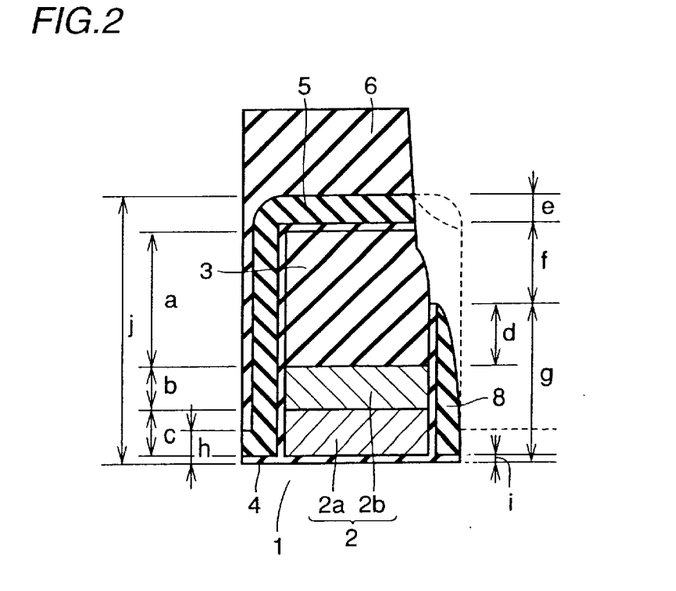
FIG. 2 shows an enlarged cross sectional view of a gate electrode and its environment shown in FIG. 1.

Next with reference to FIGS. 2–4, a characteristic structure of the semiconductor device shown in FIG. 1 is described in detail. FIG. 2 is an enlarged view of FIG. 1 which shows a cross sectional view of gate electrode 2 and its vicinity.

Referring to FIG. 2, a represents the thickness of hard mask insulating layer 3, b represents the thickness of WSi layer 2b and c represents the thickness of doped polysilicon layer 2a. d is obtained by subtracting the thickness of gate electrode 2(b+c) from the height g of SiN sidewall spacer 8, e represents an amount of etching of SiN sidewall spacer 8 resulting from etching interlayer insulating 6, and f represents the amount of etching of SiN sidewall spacer 8 generated by etching SiN stopper layer 5. h and i respectively represent the thickness of SiN stopper layer 5 and thin $SiO_2$ layer 4. j represents the total height of thin $SiO_2$ layer 4, gate electrode 2, hard mask insulating layer 3 and SiN stopper layer 5.

FIG. 3 shows a relation between values of d and a. FIG. 4 shows a relation between leakage current between gate electrode 2 and interconnection layer 9 and the value of d. The data shown in FIGS. 3 and 4 are obtained when transistor voltage is 2V.

The inventors of the invention take various factors into consideration for obtaining insulation between gate electrode 2 and interconnection layer 9 when $SiO_2$ sidewall spacer 15 used in the conventional device is not formed. As a result, it is found that leakage current between gate electrode 2 and interconnection layer 9 depends on the value d. Specifically, as shown in FIG. 4, it is found that leakage current between gate electrode 2 and interconnection layer 9 can be maintained within a range that does not cause any problem if the value of d in FIG. 2 is 20 nm or more. In other words, adequate insulation between gate electrode 2 and interconnection layer 9 can be obtained by setting the value of d in FIG. 2 at 20 nm or more. More preferably, the value of d is 30 nm or more.

The inventors of the invention note the dependence of the value of d on the thickness a of hard mask insulating layer 3. As shown in FIG. 3, if thickness a of hard mask insulating layer 3 is 120 nm or more, the value of d is found to be 20 nm or more. That is, by setting thickness a of hard mask insulating layer 3 at 120 nm or more, the value d can be set at 20 nm or more to minimize generation of leakage current between gate electrode 2 and interconnection layer 9.

Figure 5:
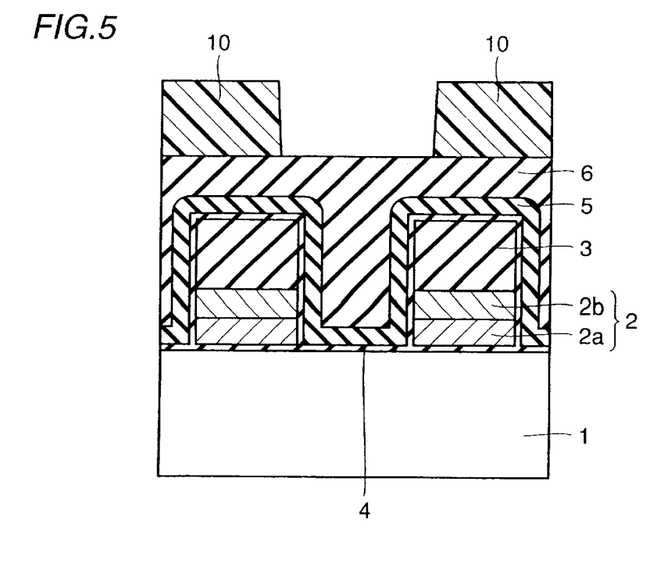
FIGS. 5–7 are cross sectional views respectively showing the first to the third steps of a fabrication process of the semiconductor device shown in FIG. 1.
Figure 6:
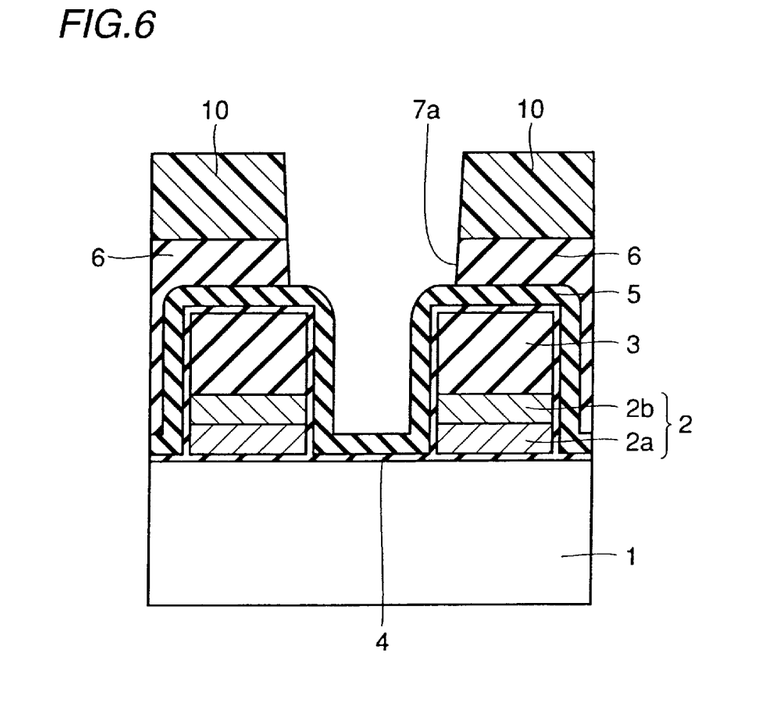
Figure 7:
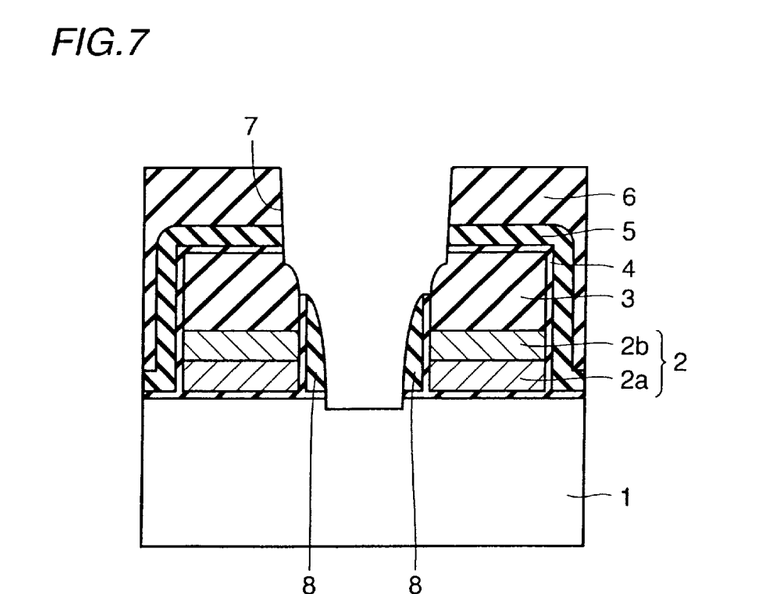

Next with reference to FIGS. 5–7, a method of fabricating the semiconductor device shown in FIG. 1 is described. FIGS. 5–7 are cross sectional views showing the first to the third steps of the fabrication process of the semiconductor device of FIG. 1.

First with reference to FIG. 5, a gate insulating layer is formed on the main surface of silicon substrate 1 using a thermal oxidation method or the like. A doped polysilicon layer 2a having a thickness of approximately 40–80 nm, a WSi 2b layer having a thickness of approximately 40–80 nm, and a silicon oxide layer having a thickness of approximately 100–250 nm are successively deposited on the gate insulating layer by the CVD, for example. By patterning the silicon oxide layer, hard mask insulating layer 3 is formed. Gate electrode 2 is formed by etching the WSi layer and the doped polysilicon layer successively using hard mask insulating layer 3 as a mask.

Next thin $SiO_2$ layer 4 of approximately 5–20 nm is formed to cover a side surface of gate electrode 2 and hard mask insulating layer 3 by CVD or the like. SiN stopper layer 5 having a thickness of about 40–100 nm is deposited on thin $SiO_2$ layer 4 by CVD or the like.

As heretofore described, SiN stopper layer 5 is directly formed on thin $SiO_2$ layer 4, and $SiO_2$ sidewall spacer 15 of the conventional semiconductor device is not provided between SiN stopper layer 5 and thin $SiO_2$ layer 4. Therefore, the plasma is not applied to the main surface of silicon substrate 1 and generation of leakage current can be effectively avoided.

After SiN stopper layer 5 is deposited as described above, interlayer insulating layer 6 formed of $SiO_2$ or the like is formed to cover SiN stopper layer 5 by CVD or the like. Resist 10 is applied onto interlayer insulating layer 6 patterned into a prescribed shape.

An opening 7a that reaches SiN stopper layer 5 is formed by etching interlayer insulating layer 6 using the patterned resist 10 as a mask. The etching is carried out by an etching apparatus of a type such as ECR (Electron Cyclotron Resonance) or magnetron RIE (Reactive Ion Etching) using flon type (i.e., fluorocarbon or fluorohydrocarbon) gas and Ar gas under a condition in which etching selectivity for the silicon nitride is high. Interlayer insulating layer 6 is etched in such a condition, and the etching is stopped at a surface of SiN stopper layer 5. Accordingly, opening 7a having a self-aligned shape is provided.

Next, with reference to FIG. 7, SiN stopper layer 5 at the bottom of opening 7a and thin $SiO_2$ layer 4 are successively etched by an etching apparatus of a type which is parallel and planar, using flon type gas containing hydrogen. As a result, the main surface of the silicon substrate is selectively exposed and SiN sidewall spacer 8 is formed.

By providing SiN sidewall spacer 8 such that the value of d in FIG. 2 is set at 20 nm or more, insulation between interconnection layer 9 which is formed later and gate electrode 2 can be obtained. In addition, by setting the thickness of hard mask insulating layer 3 at 120 nm or more when the hard mask insulating layer 3 is formed, the value of d can be almost surely set at 20 nm or more.

After forming contact hole 7 in self alignment manner as above, interconnection layer 9 is formed to extend from the inside of contact hole 7 onto interlayer insulating layer 6 by the CVD or the like. Accordingly, the semiconductor device shown in FIG. 1 is formed through the above steps.

Second Embodiment

Figure 8:
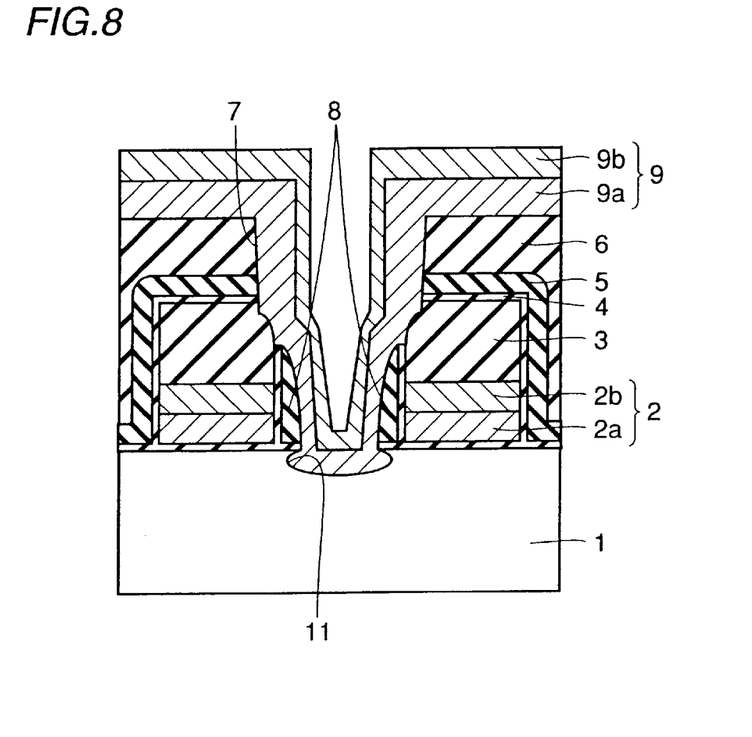
FIG. 8 is a cross sectional view showing a semiconductor device according to the second embodiment of the invention.

Next, with reference to FIGS. 8 and 9, the second embodiment of the invention is described. FIG. 8 is a cross sectional view illustrating a semiconductor device according to the second embodiment.

Referring to FIG. 8, a concave portion 11 is formed at the main surface of silicon substrate 1 according to the second embodiment. Concave portion 11 is formed to extend to a portion directly under SiN sidewall spacer 8. Concave portion 11 is filled with a part of doped polysilicon layer 9a.

By forming concave portion 11 at the main surface of silicon substrate 1, a layer which is different in quality at the bottom portion of contact hole 7 can be removed. Since a part of interconnection layer 9 fills concave portion 11, contact resistance between interconnection layer 9 and silicon substrate 1 can be decreased. The depths of concave portion 11 is, for example, about 5–40 nm.

Figure 9:
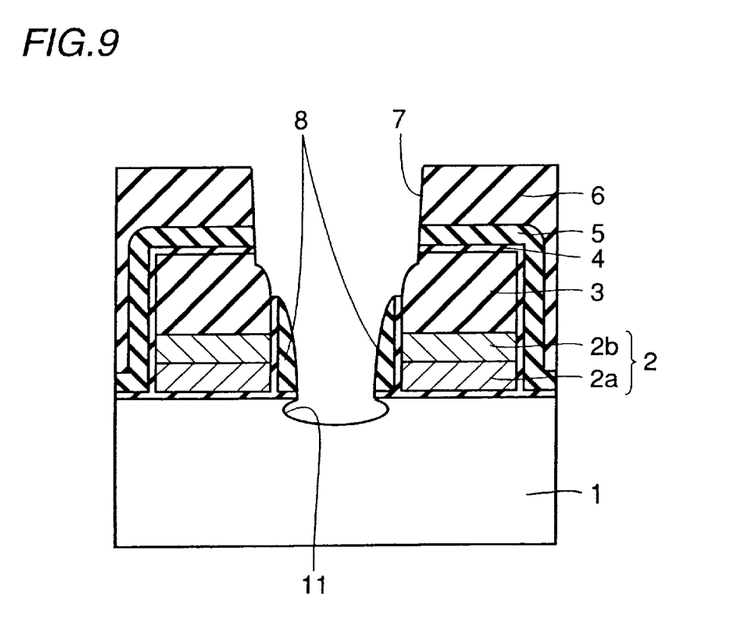
FIG. 9 is a cross sectional view showing a characteristic fabrication process of the semiconductor device shown in FIG. 8.

Next referring to FIG. 9, a method of fabricating the semiconductor device shown in FIG. 8 is described. FIG. 9 is a cross sectional view showing a characteristic fabrication process of the semiconductor device of FIG. 8.

Referring to FIG. 9, contact hole 7 is formed through the steps similar to those of the first embodiment. The main surface of silicon substrate 1 is etched by an isotropic polysilicon etching apparatus of down flow type using gas of $CF_4$, $O_2$ type or the like. At this time, silicon substrate 1 is etched without etching most of SiN sidewall spacer 8. As a result, concave portion 11 can be formed to extend to the substrate portion under SiN sidewall spacer 8 while maintaining insulation between gate electrode 2 and interconnection layer 9. The semiconductor device shown in FIG. 8 is thereafter formed through the steps similar to those of the first embodiment.

Third Embodiment

Figure 10:
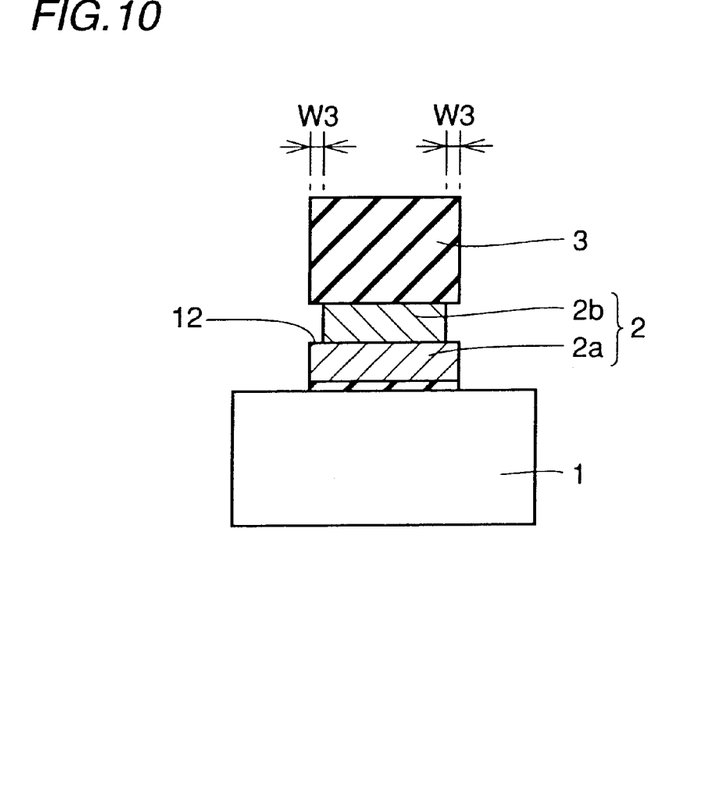
FIGS. 10–12 are cross sectional views respectively showing the characteristic first to the third steps of the fabrication process of a semiconductor device according to the third embodiment of the invention.
Figure 11:
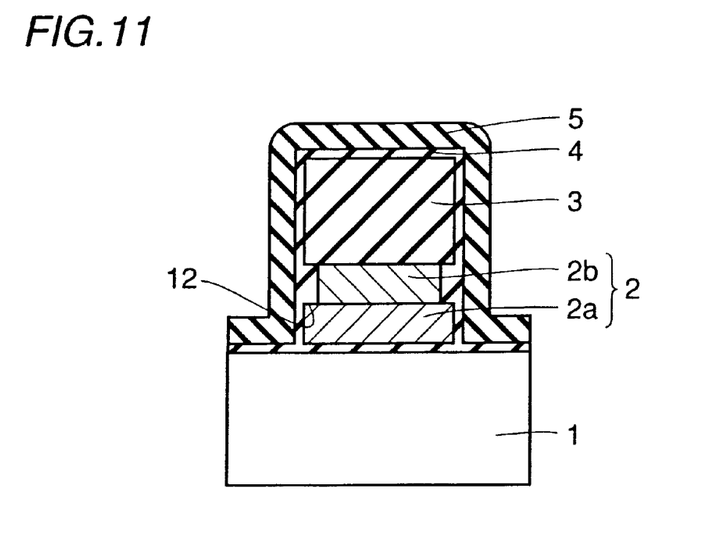
Figure 12:
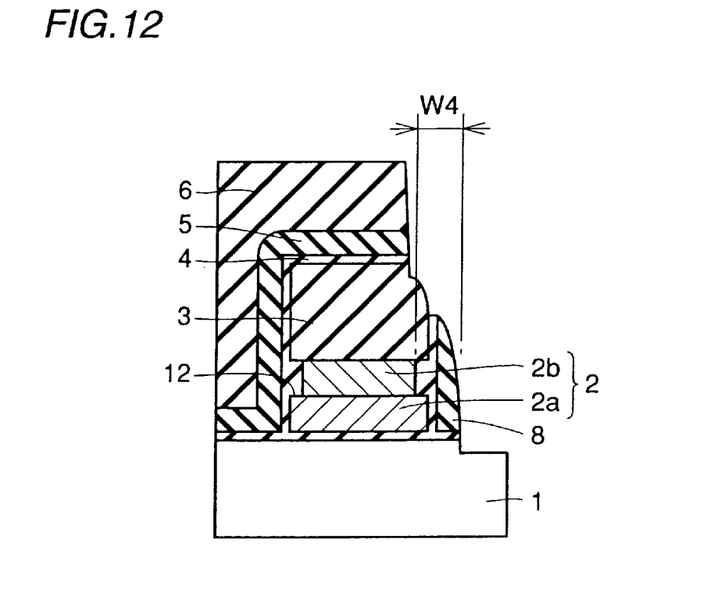

Next, referring to FIGS. 10–12, the third embodiment of the invention is described. FIGS. 10–12 are cross sectional views respectively showing the characteristic first to the third steps of a fabrication process of a semiconductor device according to the third embodiment.

First, referring to FIG. 10, after hard mask insulating layer 3 and gate electrode 2 are formed through the steps similar to those of the first embodiment, a wet etching process is applied to a side surface of WSi layer 2b for approximately 25–50 minutes using aqueous ammonia. As a result, the side surface of WSi layer 2b is recessed. The depth of the recess W3 is about 10 nm–20 nm. Accordingly, a concave portion 12 is formed at a side surface of an upper portion of gate electrode 2.

Using a method similar to that of the first embodiment, thin $SiO_2$ layer 4 and SiN stopper layer 5 are provided. Next, as shown in FIG. 12, interlayer insulating layer 6 and contact hole 7 are formed by a method similar to that of the first embodiment. Interconnection layer 9 is thereafter formed in contact hole 7.

The semiconductor device according to the third embodiment is thus formed through the steps described above. In the semiconductor device of the third embodiment, the side surface of WSi layer 2b is recessed inward, so that a separation width W4 between the upper corner portion of gate electrode 2 and interconnection layer 9 can be increased compared with that of each embodiment described above. As a result, insulation between gate electrode 2 and interconnection layer 9 can be surely maintained.

Fourth Embodiment

Figure 13A:
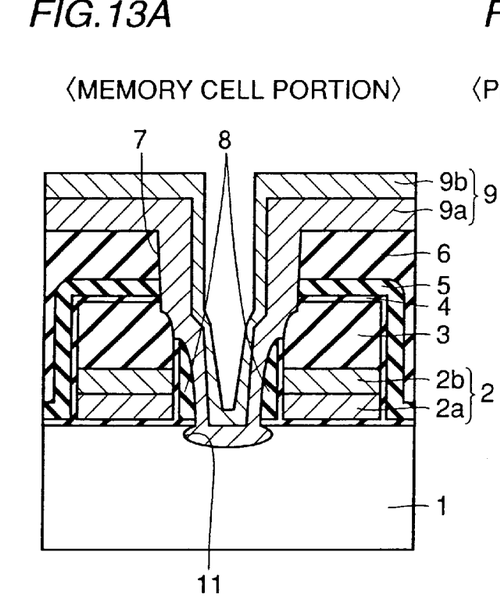
FIGS. 13A and 13B are cross sectional views showing a semiconductor device according to the fourth embodiment of the invention.
Figure 13B:
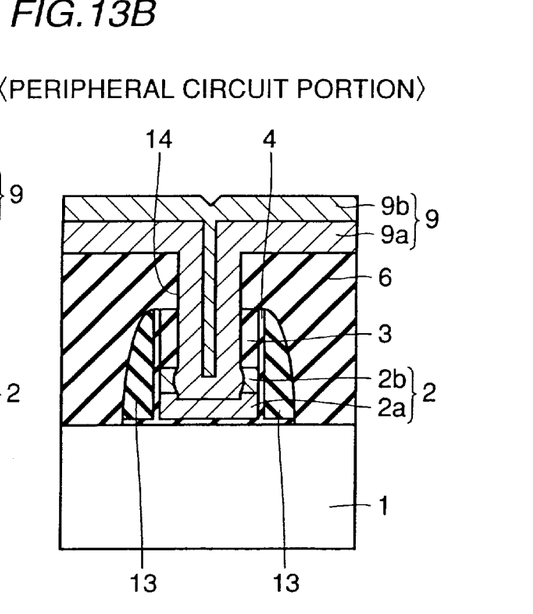

Next, referring to FIGS. 13A and B to 18A and B, the fourth embodiment of the invention is described. FIGS. 13A and B are cross sectional views showing a semiconductor device of the fourth embodiment. According to the fourth embodiment, not only a structure of a memory cell portion of a DRAM but, a structure of its peripheral circuit portion are illustrated.

Referring to FIGS. 13A and B, the structure in the memory cell portion is similar to that shown in FIG. 8, and description thereof is not repeated here. In the peripheral circuit portion, gate electrode 2 is formed on the main surface of silicon substrate 1 with the gate insulating layer interposed, and hard mask insulating layer 3 is formed thereon. An SiN sidewall spacer 13 is formed to cover both of a side surface of hard mask insulating layer 3 and a side surface of gate electrode 2 with thin $SiO_2$ layer 4 interposed. SiN sidewall spacer 13 is provided by etching SiN stopper layer 5, and formed directly on thin $SiO_2$ layer 4.

Interlayer insulating layer 6 is extended on hard mask insulating layer 3 to be in contact with a top surface of hard mask insulating layer 3. A contact hole 14 is formed to penetrate interlayer insulating layer 6, hard mask insulating layer 3 and WSi layer 2b. Interconnection layer 9 is formed to extend from the inside of contact hole 14 onto interlayer insulating layer 6.

As shown in FIG. 13B, since contact hole 14 is formed to penetrate WSi layer 2b, doped polysilicon layer 9a and doped polysilicon layer 2a can be in direct contact with each other. If doped polysilicon layer 9a is in contact with WSi layer 2b, impurities from doped polysilicon layer 9a are absorbed by WSi layer 2b and a portion where the concentration of impurities is low is formed between doped polysilicon layer 9a and WSi layer 2b. As a result, if doped polysilicon layer 9a is in contact with only WSi layer 2b, contact resistance between interconnection layer 9 and gate electrode 2 increases.

On the other hand, if doped polysilicon layer 9a and doped polysilicon layer 2a are in contact with each other, a portion where the concentration of impurities is low is not and gate electrode 2 are in contact with each other. Accordingly, increase of contact resistance between interconnection layer 9 and gate electrode 2 can be effectively avoided.

Figure 14A:
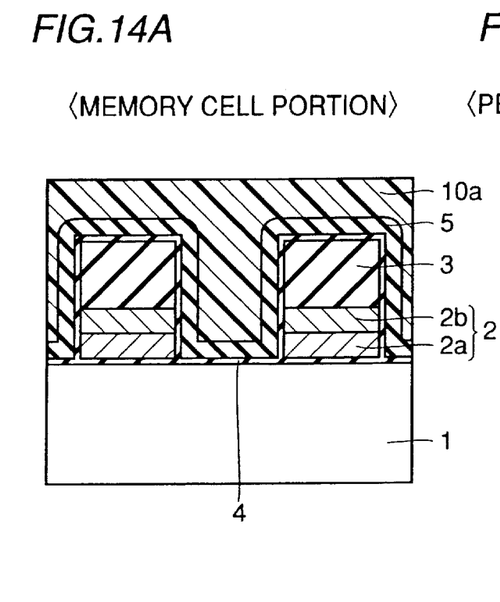

Next, referring to FIGS. 14A and B to 18A and B, a method of fabricating a semiconductor device according to the fourth embodiment is described. FIGS. 14A and B to 18A and B are cross sectional views showing the characteristic first step to the fifth step of a fabrication process of a semiconductor device according to the fourth embodiment.

Figure 14B:
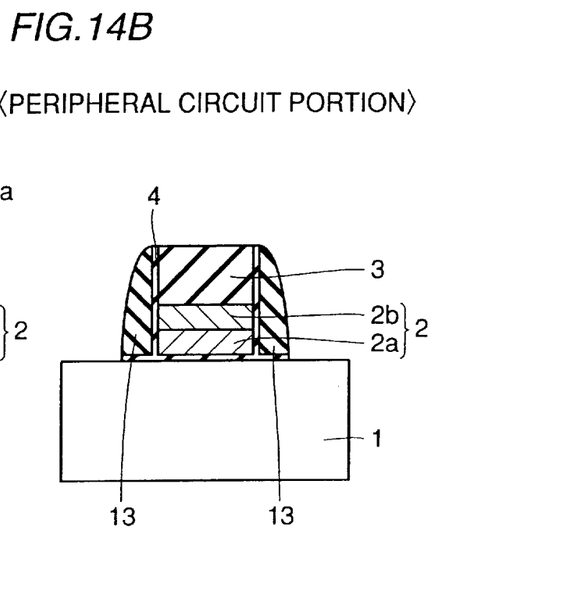

First referring to FIGS. 14A and B, SiN stopper layer 5 is formed through the steps similar to those of the first embodiment. A resist 10a is formed to cover SiN stopper layer 5 in the memory cell portion. Using resist 10a as a mask, SiN stopper layer 5 in the peripheral circuit portion is etched back. SiN sidewall spacer 13 is formed to expose a top surface of hard mask insulating layer 3 and cover both side surfaces of gate electrode 2. Resist 10a is thereafter removed.

Figure 15A:
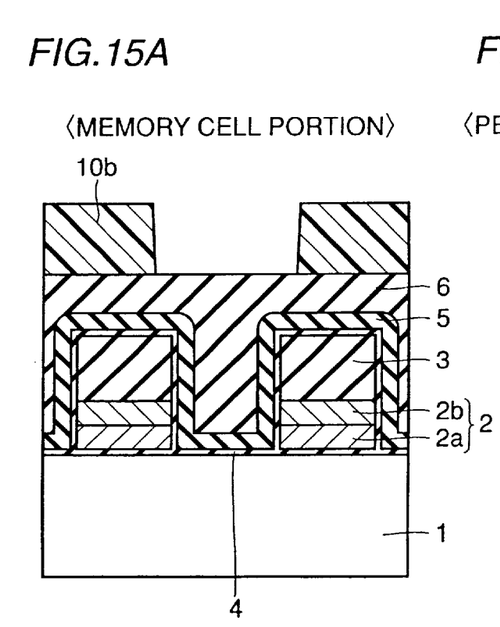
Figure 15B:
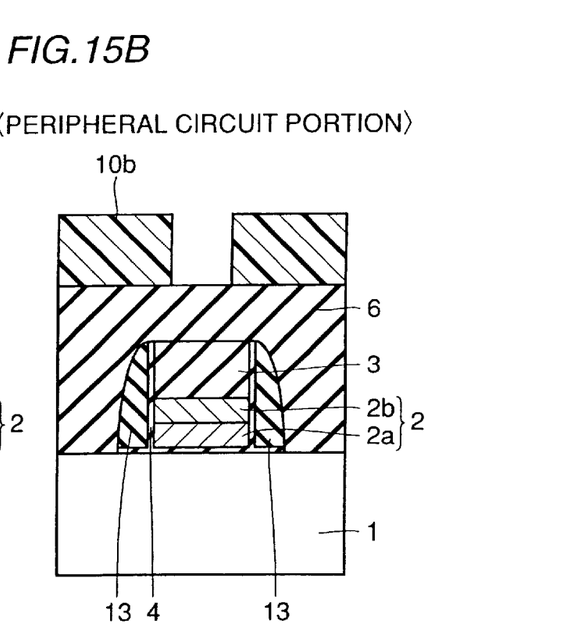

Next, referring to FIGS. 15A and B, interlayer insulating layer 6 is formed by a method similar to that of the first embodiment, and a patterned resist 10b is formed thereon. Resist 10b is provided with openings respectively in the memory cell portion and the peripheral circuit portion as shown in FIGS. 15A and B.

Figure 16A:
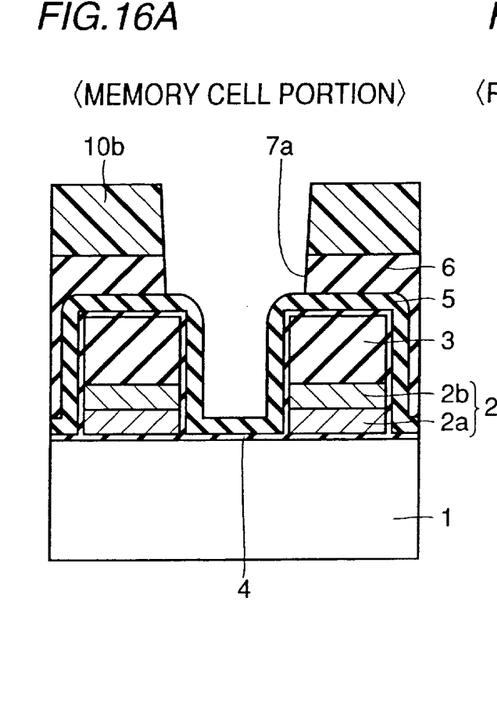
Figure 16B:
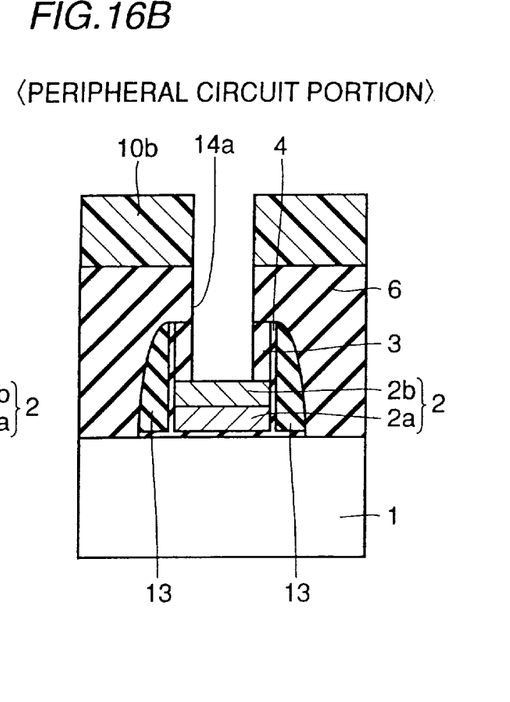

Referring to FIGS. 16A and B next, using resist 10b as a mask, interlayer insulating layer 6 is etched by a method similar to that of the first embodiment. A part of a surface of SiN stopper layer 5 in the memory cell portion is exposed, and a contact hole 14a that penetrates interlayer insulating layer 6 and hard mask insulating layer 3 and reaches WSi layer 2b is formed in the peripheral circuit portion. Since SiN stopper layer 5 is not formed on hard mask insulating layer 3 in the peripheral circuit portion, contact hole 14a that reaches WSi layer 2b can be provided.

Figure 17A:
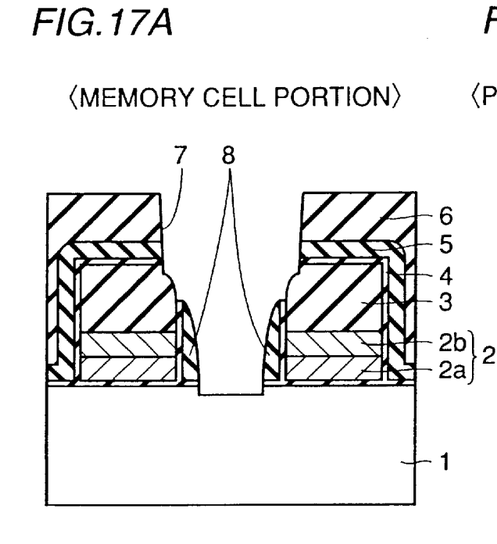
Figure 17B:
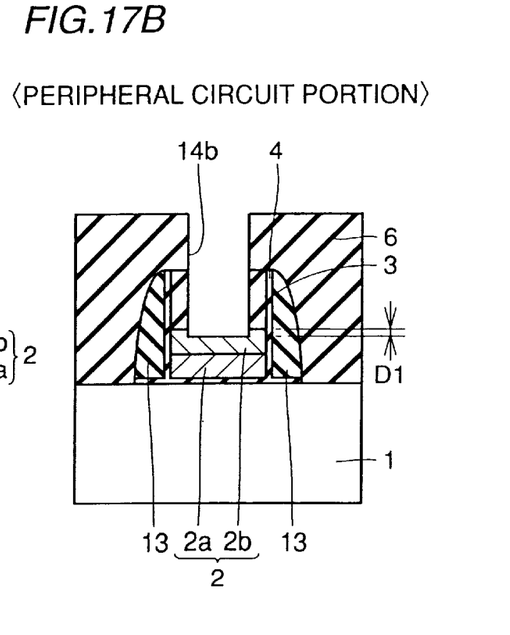

Referring to FIGS. 17A and B, SiN stopper layer 5 and thin $SiO_2$ layer 4 at a bottom portion of opening 7a are etched by an etching apparatus that is of a parallel and planar type using flon type gas containing hydrogen. As a result, the main surface of silicon substrate 1 is selectively exposed. In the peripheral circuit portion, WSi layer 2b is overetched by D1. Using the same mask, contact hole 7 formed in self alignment manner in the memory cell portion as well as contact hole 14b formed on gate electrode 2 in the peripheral circuit portion are provided.

Figure 18A:
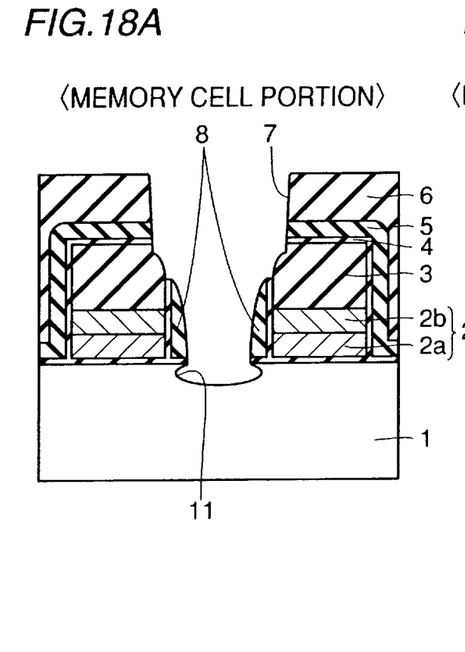
Figure 18B:
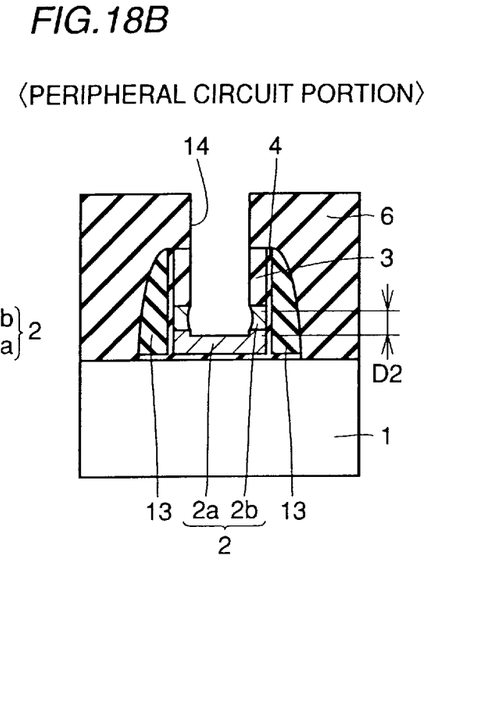

As shown in FIG. 18A and B, a concave portion 11 is formed at the main surface of silicon substrate 1 located in the memory cell portion by a method similar to that of the second embodiment. The depth of concave portion 11 is approximately 5–100 nm. In the peripheral circuit portion, WSi layer 2b is overetched by D2. D2 is 20 nm or more, for example. Contact hole 14 that reaches doped polysilicon layer 2a is thus formed in the peripheral circuit portion.

Interconnection layer 9 is thereafter formed in each of contact holes 7 and 14. The semiconductor device shown in FIG. 13 is accordingly obtained through the steps described above.

In the semiconductor device according to the present invention, the $SiO_2$ sidewall spacer is not formed so that application of plasma onto the main surface of the silicon substrate can be avoided, and the area of the opening at the bottom portion of the contact hole formed between the gate electrodes can be increased. As a result, generation of leakage current in the semiconductor device can be avoided and contact resistance between the interconnection layer formed in the contact hole and the semiconductor substrate can be decreased. A semiconductor device with high performance and high reliability can be obtained accordingly.

According to one aspect of the fabrication method of a semiconductor device of the present invention, the nitride stopper layer is directly formed on the thin insulating layer. Since the $SiO_2$ sidewall spacer is not formed, the effects as described above can be also obtained.

According to another aspect of the fabrication method of a semiconductor device of the invention, the first contact hole that selectively exposes the main surface in the memory cell portion and the second contact hole that reaches the second gate electrode in the peripheral circuit portion are simultaneously formed using the second mask layer. Since the first and second contact holes are formed using the same mask, the fabrication process can be simplified and the fabrication cost can be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a gate electrode formed on a main surface of a semiconductor substrate;

a hard mask insulating layer greater than about 120 nm thick formed on a top surface of said gate electrode;

a thin insulating layer formed to cover side surfaces of said gate electrode and side and top surfaces of said hard mask insulating layer;

a nitride stopper layer greater than about 40 nm thick but not greater than about 100 nm thick formed directly on said thin insulating layer to cover one side surface of said gate electrode and extend over the top surface of said hard mask insulating layer;

a nitride sidewall spacer layer formed directly on said thin insulating layer to cover the other side surface of said gate electrode, the height of said nitride sidewall spacer layer in a direction perpendicular to said main surface being greater than the thickness of said gate electrode in said perpendicular direction by at least 20 nm;

an interlayer insulating layer formed to cover said nitride stopper layer, having a contact hole that reaches said main surface and said nitride sidewall spacer layer, and an interconnection layer formed in said contact hole.

2. The semiconductor device according to claim 1 wherein a concave recess is formed in said main surface of said semiconductor substrate in the vicinity of said nitride sidewall spacer layer, said recess extending for a distance beneath said nitride sidewall spacer layer, and a part of said interconnection layer fills said concave recess.

3. The semiconductor device according to claim 1, wherein the gate electrode comprises upper and lower conductive layers in contact with each other; and a part of said upper conductive layer of said gate electrode at said other side surface of said gate electrode is recessed from a side surface of said hard mask insulating layer.

4. A semiconductor device comprising:

a gate electrode formed on a main surface of a semiconductor substrate;

a hard mask insulating layer formed on a top surface of said gate electrode;

a thin insulating layer formed to cover side surfaces of said gate electrode and side and top surfaces of said hard mask insulating layer;

a nitride stopper layer formed directly on said thin insulating layer to cover one side surface of said gate electrode and extend over the top surface of said hard mask insulating layer;

a sidewall nitride stopper layer formed directly on said thin insulating layer to cover the other side surface of said gate electrode;

an interlayer insulating layer formed to cover said nitride stopper layer, having a contact hole that reaches said main surface and said sidewall nitride layer, and an interconnection layer formed in said contact hole, wherein said semiconductor device has a memory cell portion and a peripheral circuit portion, said gate electrode is arranged in said memory cell portion, another gate electrode having a metal silicide portion at its upper part is formed in said peripheral circuit portion, another hard mask insulating layer is formed on a top surface of said another gate electrode, another thin insulating layer is formed to cover a side surface of said another gate electrode and said another hard mask insulating layer, a pair of another sidewall nitride layers is directly formed on said another thin insulating layer to cover both side surfaces of said another gate electrode, said interlayer insulating layer extends on said another hard mask insulating layer to be in contact with a top surface of said another hard mask insulating layer, another contact hole is formed to penetrate said interlayer insulating layer, said another hard mask insulating layer, and said metal silicide portion, and have its bottom surface in said another gate electrode, and another interconnection layer is formed in said another contact hole to be electrically connected to said another gate electrode.

* * * * *